United States Patent
Desize

(10) Patent No.: US 6,693,492 B2
(45) Date of Patent: Feb. 17, 2004

(54) VARIABLE GAIN LOW-NOISE AMPLIFIER AND METHOD

(75) Inventor: Paul B. Desize, Wildomar, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/863,661

(22) Filed: May 18, 2001

(65) Prior Publication Data

US 2002/0171492 A1 Nov. 21, 2002

(51) Int. Cl.[7] ................................................ H03G 3/12
(52) U.S. Cl. ...................................... 330/283; 330/300
(58) Field of Search ................................ 330/283, 284, 330/300

(56) References Cited

U.S. PATENT DOCUMENTS

| | | | |
|---|---|---|---|
| 5,532,471 A | * | 7/1996 | Khorramabadi et al. .... 330/283 |
| 5,708,392 A | * | 1/1998 | Gross ......................... 330/110 |
| 5,710,523 A | | 1/1998 | Kobayashi .................. 330/293 |
| 6,175,279 B1 | | 1/2001 | Ciccarelli et al. ........... 330/296 |
| 6,181,206 B1 | | 1/2001 | Palmisano et al. .......... 330/278 |

* cited by examiner

*Primary Examiner*—Khanh Van Nguyen
(74) *Attorney, Agent, or Firm*—Blakely, Sokoloff, Taylor & Zafman LLP

(57) ABSTRACT

A degenerating device is connected between the emitter of the amplifying transistor and ground. A resistor connected across the FET switch provides a finite limit, the total resistance in the emitter circuit of the amplifying transistor. Additional circuitry may be provided in the emitter-based circuit of the amplifying transistor such as an impedance correcting circuit designed to compensate for changing base input impedance, the result of change in the resistance of the degeneration circuit.

11 Claims, 3 Drawing Sheets

VARIABLE GAIN LOW-NOISE AMPLIFIER AND METHOD

FIELD OF INVENTION

The present invention relates to a low-noise variable gain amplifier utilizing variable degeneration to provide gain control.

BACKGROUND OF THE INVENTION

Low-noise variable gain amplifiers have a wide range of applications, one significant application is in solid state radio telephones. It is desirable to provide for a low-noise variable gain operation under a wide range of circumstances. In a common prior art environment, a transistor amplifier is utilized operating an amplifier transistor in the common emitter mode, with the emitter of the amplifier transistor connected to ground. Gain control is accomplished by bypassing the base-emitter circuit of the amplifier transistor with a field effect transistor (FET) or similar switch. The amplifier transistor is turned off by removing forward bias. If the emitter is connected to a true ground, the optimum noise figure for the amplifying transistor can be realized. However, once the switch is energized and the amplifying transistor is turned off, the output to input isolation of the amplifying transistor is drastically reduced. In the active state, the amplifying transistor output to input isolation is normally 30–40 dB, but the isolation drops to 5 decibels or less when the amplifying transistor is off, particularly in single stage low-noise amplifiers. It is therefore desirable to keep the amplifying transistor active, but with reduced gain.

A common prior art method of remedying this situation is to reduce the gain of the amplifying transistor by lowering the operating current. This, however, provides a significant disadvantage in that lowering the operating current also reduces the third order intercept point (IP3) of the amplifier. In other words, the dynamic range of the amplifier is reduced. A reduction in dynamic range is highly undesirable since the amplifier is normally required to handle increased input signal levels in the reduced gain mode.

One technique used to reduce the gain, stabilize and increase the dynamic range of amplifying transistors is degeneration. Degeneration comprises placing an unbiased resistor in the emitter-ground circuit. The larger the resistance, the more the gain is reduced. Degeneration, however, lifts the emitter off radio frequency ground and raises input impedance of the amplifier in proportion to the resistance. If the resistor were replaced by a substantially ideal device, an on-resistance of zero ohms at the frequency of the signal being amplified, zero inductance and an off-resistance of greater than 1000 ohms, operation would be highly satisfactory. However, devices idealized to this extent are not available.

SUMMARY OF THE INVENTION

It is a general object of the present invention to provide a low-noise, variable gain amplifier maintaining satisfactory input-output isolation in a reduced gain mode. It is another general object of the present invention to retain dynamic range of the amplifier as gain is reduced. It is a further object of the present invention to provide degeneration in an amplifier maintaining satisfactory output characteristics while using non-ideal components to switch the emitter to ground circuit in a common emitter arrangement.

Briefly stated, in accordance with the present invention a degeneration circuit is provided in a variable gain, low-noise amplifier. The degeneration circuit does not require specific frequency determining elements or output matching networks. A degenerating device is connected between the emitter of the amplifying transistor and ground. A large junction field effect transistor is a suitable degeneration device because of its inherently low on-resistance and the low gain current required to switch its conductive state. A resistor connected across the FET switch provides a finite limit to the total resistance in the emitter circuit of the amplifying transistor. Additional circuitry may be provided in the emitter-base circuit of the amplifying transistor such as an impedance correcting circuit designed to compensate for changing base input impedance as the result of change in the resistance of the degeneration circuit.

BRIEF DESCRIPTION OF THE DRAWINGS

The means and method by which the foregoing features of the invention are achieved are pointed out with particularity in the claims forming the concluding portion of the specification. The invention, both as to its organization and manner of operation may be further understood by reference to the following description taken in connection with the following drawings.

Of the drawings.

DETAILED DESCRIPTION OF THE INVENTION

Figure 1:
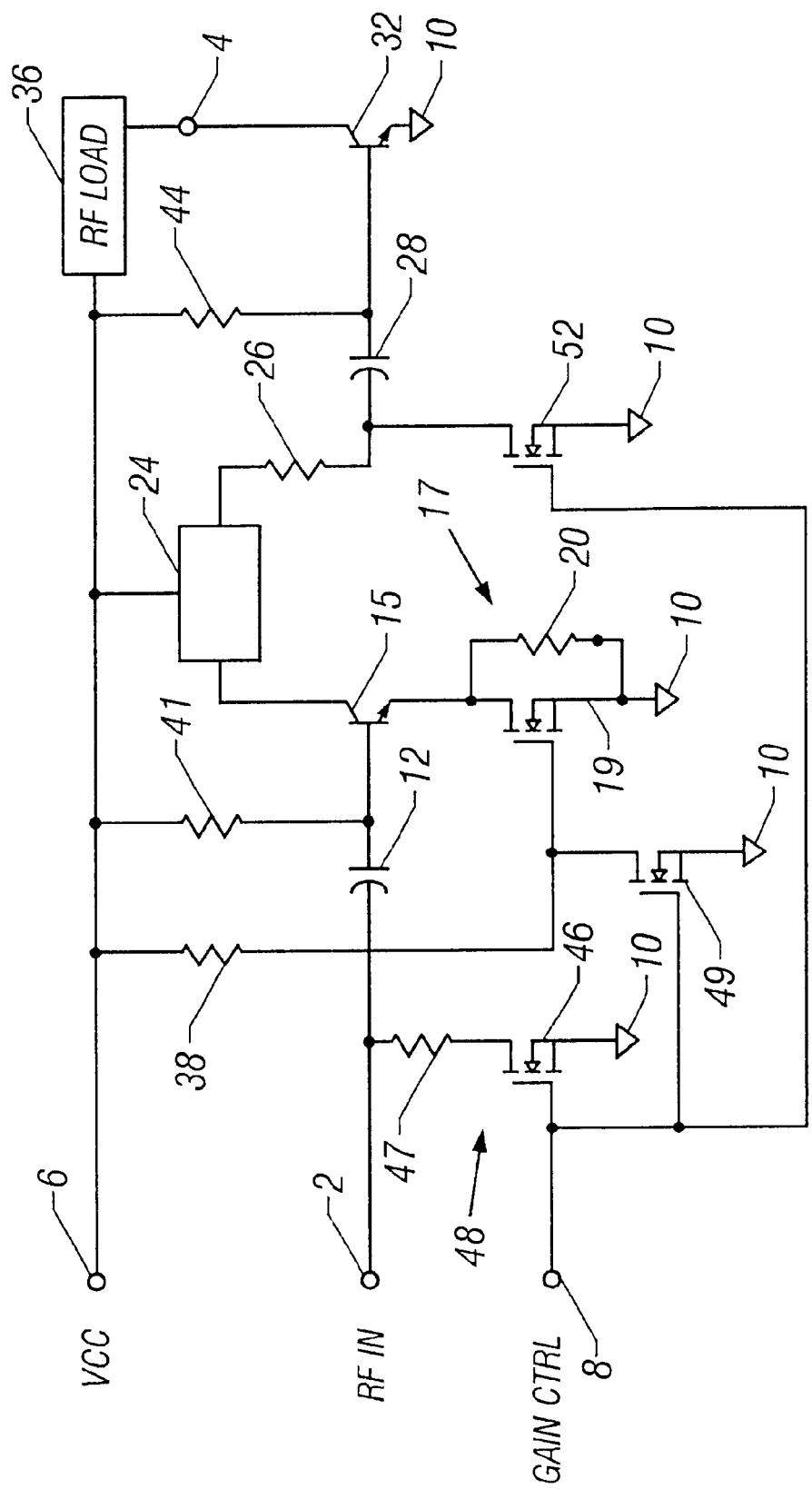
FIG. 1 is a schematic illustration of a low-noise variable gain amplifier constructed in accordance with the present invention.
Figure 2:
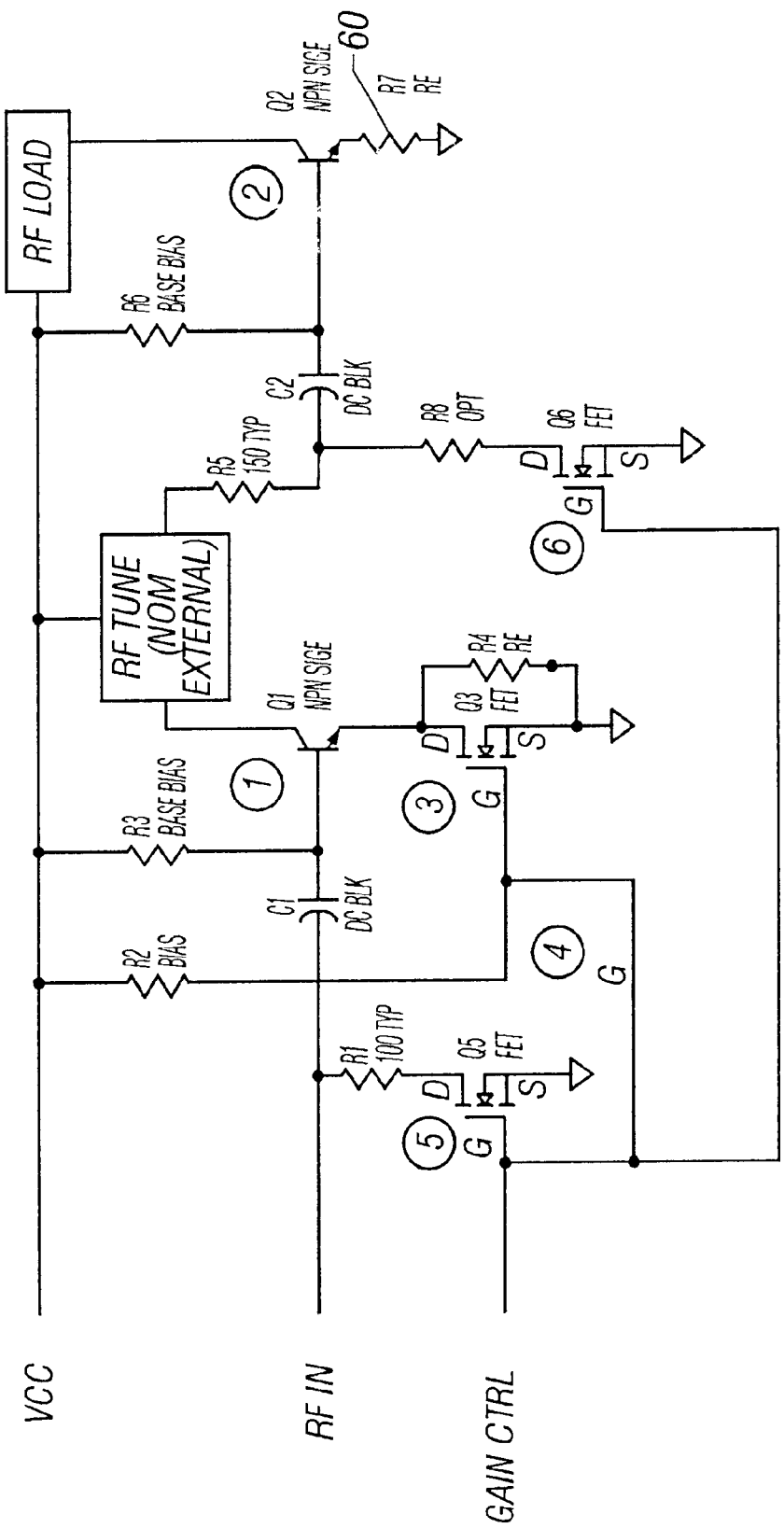
FIGS. 2 and 3 are schematic illustrations of variations on the circuit of FIG. 1.
Figure 3:
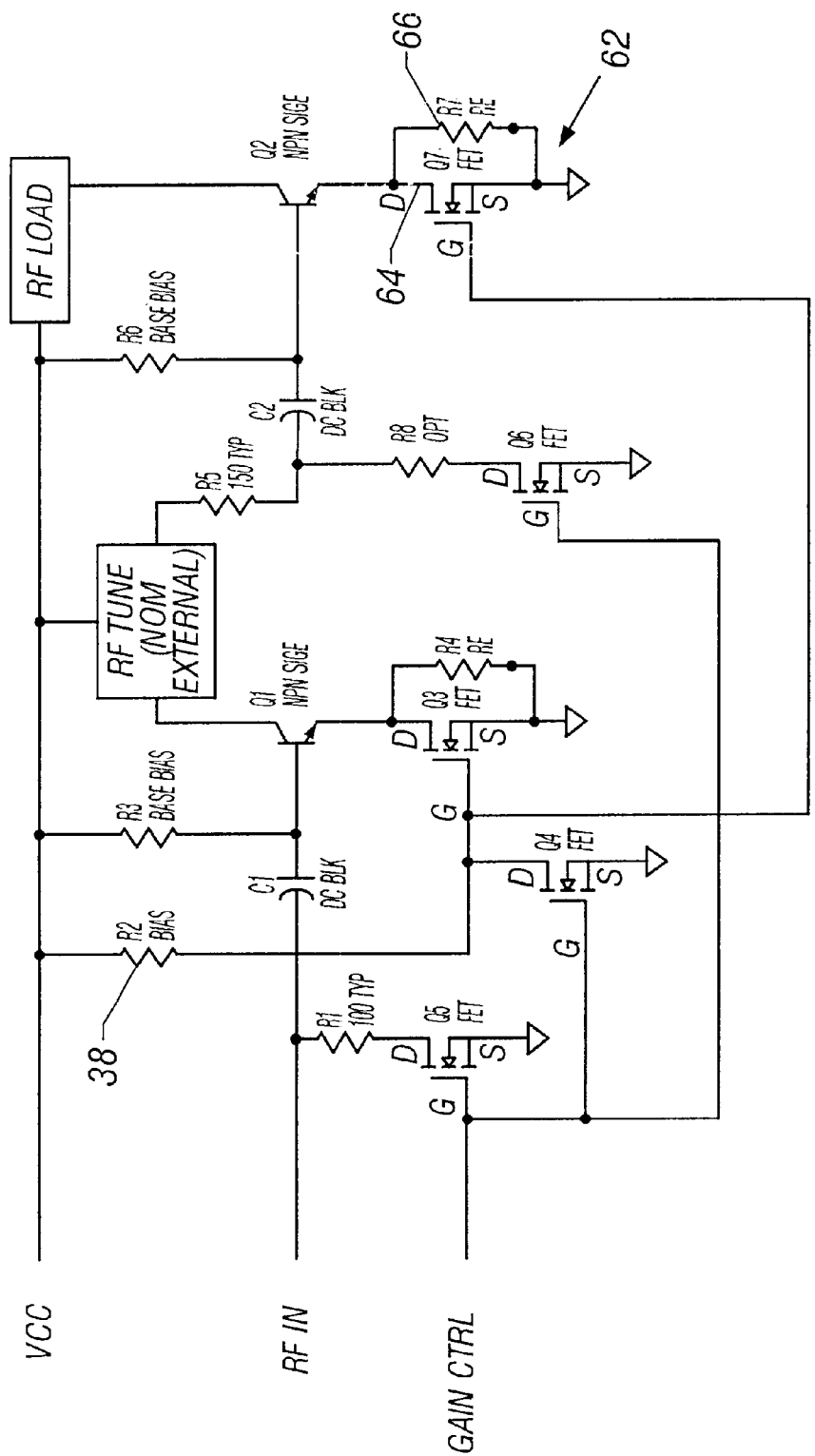

FIG. 1 is a schematic illustration of a low-noise variable gain amplifier constructed in accordance with the present invention. The same reference numerals are used to denote corresponding components in the circuits of FIGS. 1, 2 and 3. The embodiment of FIGS. 1 through 3 are discussed in the context of radio frequency application, for example a wireless telephone. However, the invention is suited for other frequency ranges as well. The amplifier of FIG. 1 comprises a radio frequency input terminal 2 and a radio frequency output terminal 4. The circuit is biased by a voltage $V_{CC}$ provided at a bias terminal 6, and a gain control input signal is applied to a terminal 8. The radio frequency input terminal 2 is AC coupled by a DC blocking capacitor 12 to an amplifying transistor 15. In the present illustration, the amplifier 15 is connected in the common emitter mode. Connected between the emitter of the amplifying transistor 15 and ground 10 is a degeneration circuit 17. The degeneration circuit 17 comprises a switch 19 and a resistor 20 connected across the switch 19. The switch 19 should have a very low resistance when on and require a low current to switch its conductive state. In the present embodiment, these characteristics are provided by selecting the switch 19 to be a large junction field effect transistor (FET). The resistor 20 provides a finite limit to the resistance of the degeneration circuit 17 when the FET 19 is off. The output of the amplifying transistor 15 at its collector is coupled to an RF tuning circuit 24 and provided via resistor 26 and AC coupled via DC blocking capacitor 28 to the input of an output transistor 32 to an RF load 36. A bias resistor 38 provides bias from the bias terminal 6 to the gate of the FET switch 19. A biasing resistor 41 provides bias voltage from the source $V_{CC}$ at terminal 6 to the base of the amplifying transistor 15. Similarly, the base of the output transistor 32 is biased by a bias resistor 44 connected between bias terminal 6 and the base of the output transistor 32.

The gain control terminal 8 is connected to the gate of further FET switches 46, 49 and 52. An impedance correcting circuit 48 comprising the FET switch 46 in series with a resistor 47 is connected across the base to ground circuit of the amplifying transistor 15. FET switch 49 is connected across the base to ground circuit of the FET switch 19 and is a simple inverter. The FET switch 52 is connected across the base emitter circuit of the output transistor 32 for further gain reduction as further described below.

In operation, a radio frequency input signal at the terminal 2 is coupled to the base of the amplifying transistor 15. The output at the collector of the amplifying transistor is coupled by the RF tuner 24 and further amplified by the transistor 32. There is essentially a zero input at the gain control voltage input terminal 8, and the FET switch 19 in the degeneration circuit 17 is on. The resistance in the collector's circuit of the amplifying transistor 15 is minimized, and high gain operation is provided. When the automatic gain control voltage is decreased, FET transistor 49 causes the attenuation of the amplifying transistor 15 to increase. An AGC voltage is decreased to the gate of the transistor 19, drain to source resistance increases. This increase reduces the gain of the amplifying transistor 15. At the point at which the resistance of the FET 19 exceeds approximately ten times the value of resistor 20, and the resistance of the FET switch 19 becomes irrelevant. The parallel-connected resistor 20 limits the total resistance of the degeneration circuit 17. The value of resistor 20 is chosen to be the amount needed to reduce the gain of amplifying transistor 15 to less than 3 dB. A nominal value would be under 100 ohms. The reduction in the collector current of the amplifying transistor 15 is small due to the low total value of resistance in the emitter circuit. The impedance correcting circuit 48 is designed to correct for the changing base input impedance of the amplifying transistor 15. The gain control voltage which causes the FET 19 to reduce the gain of the amplifying transistor 15 also tends to turn on the FET 46 to decrease the input impedance of the RF signal at the terminal 2. As the amount of degeneration is increased, additional attenuation of the input signal at terminal 2 is also increased. Therefore, although the loss in dynamic range, and level of IP3, is caused by the small reduction of collector current of the amplifying transistor 15, the full dynamic range of the amplification of the RF input signal is maintained or even increased since input signal has proportionally been decreased along with degeneration of the amplified signal. It should be noted that degeneration alone will improve IP3 performance.

The resistor 38 provides the on voltage for the FET 19 when automatic gain control voltage is low. If a negative going automatic gain control voltage is desired, an inverter may be placed on the gate of transistors 46 and 52 and the transistor 19 may be fed directly from the terminal 8. The output amplifying transistor 32 may be provided with a fixed degeneration resistor 60, as seen in FIG. 2 or a second degeneration circuit 62, as shown in FIG. 3. The second degeneration circuit 62 comprises an FET transistor 64 and a resistor 66 connected thereacross. The gate of the FET transistor 64 is biased by the biasing resistor 38.

The invention allows for the improved interaction with other stages of a transmitter and improved signal to noise ration. In a stand alone low-noise amplifier, nominal gain is 18–20 dB with an impedance matched noise figure less than 4 dB and a noise matched noise figure of as low as 1.9 dB. Gain control is usually provided in one or more discrete steps rather than as a continuous function. Commonly, a low-noise amplifier is provided to a radio frequency filter or balun and an active Gilbert cell mixer, particularly for CDMA applications. The Gilbert cell mixer has an inherently high noise figure with relatively low gain. The mixer with its own second stage noise contribution may have a noise figure in excess of 20 dB. Additionally, there is normally interstage loss within the Gilbert cell mixer. Consequently, the mixing process can add as much as 3 or 4 dB to the overall noise figure measures at the input of an 18 dB gain low-noise amplifier.

However, the variable gain design herein allows for a higher gain to be utilized, nominally 28–30 dB. Consequently, noise contribution of a Gilbert cell mixer may be reduced to tenths of a dB instead of whole decibels. While the resistance of the degenerative circuit 17 provides for an inherently higher stand-alone noise figure for a low-noise amplifier, overall performance is still improved. Simulations have shown that about 0.5 dB max at one GHertz or less and 0.7 dB max at 2 GHertz or less. This increase is far less than the voice contribution of a Gilbert cell mixer to a standard stand-alone low-noise amplifier.

The variable gain design particularly with the additional degenerative circuit 66 in the emitter circuit of the output amplifying transistor 32, allows for finer control of gain to a mixer. Consequently, output level of the mixer is more constant. A mixer with a more constant input level tends to generate fewer intermodulation products. Consequently noise level is further reduced.

Many alternatives to the specific arrangements disclosed above will suggest themselves to those skilled in the art in order to provide further variable gain low-noise amplifiers constructed in accordance with the present invention. for example, variations to the automatic gain control sequencing may be provided. Specifically, gain control inputs may be provided to the FET 46 and 64 in the embodiment of FIG. 3 and delay of first stage gain reduction may be provided while the second stage is being controlled.

Other embodiments in accordance with the present invention will suggest themselves to those skilled in the art.

What is claimed is:

1. A variable gain low-noise amplifier, comprising:
    a common emitter amplifying transistor for receiving an input signal to an input circuit at the base of said amplifying transistor at an input frequency and providing an output signal at its collector;
    a degenerative circuit connected in an emitter-ground circuit of said amplifying transistor, said degenerative circuit comprising a transistor conductive circuit and a resistor connected thereacross;
    a control electrode for coupling to a source of bias voltage, said resistor providing for a maximum resistance of said degenerative circuit, said control electrode also being coupled for receiving a gain control voltage for varying resistance of said conductive circuit in accordance with the gain control voltage; and
    an impedance correcting circuit connected across said input circuit for reducing input impedance of the input signal in accordance with increasing input impedance of said amplifying transistor comprising a variable conductive device having a control electrode coupled to receive the gain control voltage.

2. The amplifier according to claim 1 wherein said transistor conductive circuit comprises a large junction field effect transistor.

3. The amplifier of claim 1 wherein said variable conductive device comprises a large junction field effect transistor.

4. The amplifier of claim 3 further comprising a second amplifier transistor connected to amplify the output of said first amplifying transistor and provide an output for connection to a load.

5. The amplifier according to claim 4 wherein said second transistor is connected in the common emitter mode.

6. The amplifier according to claim 5 further comprising a degenerative transistor connected between the emitter of said second amplifying transistor in ground.

7. The amplifier of claim 4 further comprising a second degenerative circuit connected between the emitter of said second amplifying transistor and ground.

8. The amplifier according to claim 7 further comprising an impedance correcting circuit connected in the input circuits of said second amplifying transistor.

9. The amplifier of claim 8 wherein each said large junction FET transistor is of the PNP type and wherein a voltage of opposite polarity to the gain control voltage is supplied to the transistor in said first degenerative circuit.

10. The amplifier according to claim 3 wherein each said large junction FET transistor is of the PNP type and wherein a voltage of opposite polarity to the gain control voltage is supplied to the transistor in said first degenerative circuit.

11. A method for degenerative control gain in a variable low-noise common emitter amplifier, comprising the steps of:

increasing resistance of an emitter ground circuit of the amplifier in accordance with a gain control signal to provide degenerative operation; and limiting increase in the resistance to a maximum amount;

wherein said step of increasing resistance comprises increasing the resistance in correspondence to input signal amplitude to the amplifier, said method further comprising operating an output transistor cascaded with the amplifier.

* * * * *